(12) United States Patent
Herner et al.

(10) Patent No.: US 7,285,464 B2
(45) Date of Patent: Oct. 23, 2007

(54) NONVOLATILE MEMORY CELL COMPRISING A REDUCED HEIGHT VERTICAL DIODE

(75) Inventors: S. Brad Herner, San Jose, CA (US);
Steven J. Radigan, Fremont, CA (US)

(73) Assignee: Sandisk 3D LLC, Milpitas, CA (US)

( * ) Notice: Subject to any disclaimer, the term of this patent is extended or adjusted under 35 U.S.C. 154(b) by 180 days.

(21) Appl. No.: 11/015,824

(22) Filed: Dec. 17, 2004

(65) Prior Publication Data

US 2005/0098800 A1 May 12, 2005

Related U.S. Application Data

(63) Continuation-in-part of application No. 10/955,549, filed on Sep. 29, 2004, which is a continuation-in-part of application No. 10/855,784, filed on May 26, 2004, now Pat. No. 6,952,030, which is a continuation of application No. 10/326,470, filed on Dec. 19, 2002, now abandoned.

(51) Int. Cl.
*H01L 21/336* (2006.01)

(52) U.S. Cl. ............... 438/258; 438/257; 438/593; 438/594; 257/314; 257/315

(58) Field of Classification Search .......... 438/3, 438/596, 257–258; 365/117, 145
See application file for complete search history.

(56) References Cited

U.S. PATENT DOCUMENTS 6,034,882 A * 3/2000 Johnson et al. ............. 365/103
7,026,212 B2 * 4/2006 Herner et al. ............... 438/257

* cited by examiner

*Primary Examiner*—Dung A. Le
(74) *Attorney, Agent, or Firm*—Dugan & Dugan, PC

(57) ABSTRACT

A nonvolatile memory cell according to the present invention comprises a bottom conductor, a semiconductor pillar, and a top conductor. The semiconductor pillar comprises a junction diode, including a bottom heavily doped region, a middle intrinsic or lightly doped region, and a top heavily doped region, wherein the conductivity types of the top and bottom heavily doped region are opposite. The junction diode is vertically oriented and is of reduced height, between about 500 angstroms and about 3500 angstroms. A monolithic three dimensional memory array of such cells can be formed comprising multiple memory levels, the levels monolithically formed above one another.

33 Claims, 7 Drawing Sheets

US 7,285,464 B2

NONVOLATILE MEMORY CELL COMPRISING A REDUCED HEIGHT VERTICAL DIODE

RELATED APPLICATIONS

This application is a continuation-in-part of Herner, U.S. patent application Ser. No. 10/955,549 "Nonvolatile Memory Cell Without a Dielectric Antifuse Having High- and Low-Impedance States," filed Sep. 29, 2004, hereinafter the '549 application; which is a continuation in part of Herner et al., U.S. patent application Ser. No. 10/855,784, now U.S. Pat. No. 6,952,030, "An Improved Method for Making High-Density Nonvolatile Memory," filed May 26, 2004; which is a continuation of Herner et al., U.S. patent application Ser. No. 10/326,470, "An Improved Method for Making High-Density Nonvolatile Memory," filed Dec. 19, 2002 (since abandoned) and hereinafter the '470 application, all assigned to the assignee of the present invention and hereby incorporated by reference in their entirety.

BACKGROUND OF THE INVENTION

The invention relates to a memory cell comprising a vertically oriented semiconductor pillar disposed between conductors, wherein the semiconductor pillar is of reduced height.

A nonvolatile memory array may comprise cells in which a vertically oriented diode is interposed between a lower conductor and an upper conductor. The cell is initially high resistance, and a programming voltage applied between the conductors permanently converts the cell to a lower resistance.

It is advantageous to reduce the programming voltage required to program a cell in such an array.

SUMMARY OF THE PREFERRED EMBODIMENTS

The present invention is defined by the following claims, and nothing in this section should be taken as a limitation on those claims. In general, the invention is directed to a memory cell comprising a semiconductor pillar, the semiconductor pillar comprising a vertically oriented junction diode of reduced height.

A first aspect of the invention provides for nonvolatile memory cell comprising a rail-shaped first conductor formed at a first height above a substrate; a rail-shaped second conductor formed above the first conductor; a first vertically oriented pillar comprising a first p-i-n diode, the first pillar disposed between the second conductor and the first conductor, the first diode comprising an intrinsic or lightly doped region, wherein the intrinsic or lightly doped region has a first thickness of about 300 angstroms or greater.

Another aspect of the invention provides for a method for forming a plurality of nonvolatile memory cells, the method comprising forming a plurality of substantially parallel, substantially coplanar first conductors at a first height above a substrate; forming a plurality of vertically oriented first pillars comprising vertically oriented first polysilicon diodes above the first conductors; and forming a plurality of substantially parallel, substantially coplanar second conductors above the first pillars, wherein, after formation of the second conductors, the first polysilicon diodes have a height between about 500 angstroms and about 3500 angstroms.

Yet another aspect of the invention provides for a method for forming a nonvolatile memory cell, the method comprising forming a rail-shaped first conductor; forming a vertically oriented junction diode comprising polysilicon above the first conductor; and forming a rail-shaped second conductor above the junction diode, wherein, after formation of the second conductor, the height of the junction diode is between about 500 angstroms and about 3500 angstroms.

A preferred embodiment of the invention provides for a monolithic three dimensional memory array comprising i) a first memory level, the first memory level comprising: a) a plurality of substantially parallel, substantially coplanar first conductors formed above a substrate; b) a plurality of substantially parallel, substantially coplanar second conductors formed above the first conductors; and c) a plurality of vertically oriented first junction diodes, each first junction diode disposed between one of the first conductors and one of the second conductors, wherein the first junction diodes have a first height between about 500 angstroms and about 3500 angstroms; and ii) at least a second memory level monolithically formed on the first memory level.

Another preferred embodiment of the invention provides for a method for forming a monolithic three dimensional memory array, the method comprising: i) forming a first memory level, the steps for forming the first memory level comprising: a) forming a plurality of substantially parallel, substantially coplanar first conductors above a substrate; b) forming a plurality of substantially parallel, substantially coplanar second conductors above the first conductors; c) forming a plurality of first vertically oriented pillars, each first pillar comprising a first junction diode and disposed between one of the first conductors and one of the second conductors, wherein the first junction diodes have a first height between about 500 angstroms and about 3500 angstroms; and ii) monolithically forming a second memory level on the first memory level.

Another aspect of the invention provides for a method for forming a nonvolatile memory cell, the method comprising forming a first rail-shaped conductor above a substrate; forming a second rail-shaped conductor above the first conductor; forming a first substantially vertical pillar disposed between the first conductor and the second conductor, the first pillar comprising a vertically oriented p-i-n diode, the p-i-n diode comprising a) a bottom heavily doped region having a first conductivity type, b) a middle intrinsic or lightly doped region, and c) a top heavily doped region having a second conductivity type opposite the first conductivity type, wherein the bottom heavily doped region is doped by implantation of arsenic ions and the top heavily doped region is doped by implantation of $BF_2$ ions.

A related preferred embodiment provides for a method for forming a monolithic three dimensional memory array, the method comprising forming a first plurality of substantially parallel, substantially coplanar rail-shaped conductors above a substrate; forming a second plurality of substantially parallel, substantially coplanar rail-shaped conductors above the first conductors; forming a first plurality of substantially vertical pillars, each first pillar disposed between one of the first conductors and one of the second conductors, each of the first pillars comprising a vertically oriented p-i-n diode, each p-i-n diode comprising a) a bottom heavily doped region having a first conductivity type, b) a middle intrinsic or lightly doped region, and c) a top heavily doped region having a second conductivity type opposite the first conductivity type, wherein the bottom heavily doped region is doped by implantation of arsenic ions and the top heavily doped region is doped by implantation of $BF_2$ ions.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIG. 5a is a perspective view of adjacent memory levels sharing conductors, while

FIG. 6a is a perspective view of adjacent memory levels not sharing conductors, while

DETAILED DESCRIPTION OF THE PREFERRED EMBODIMENTS

Figure 1:
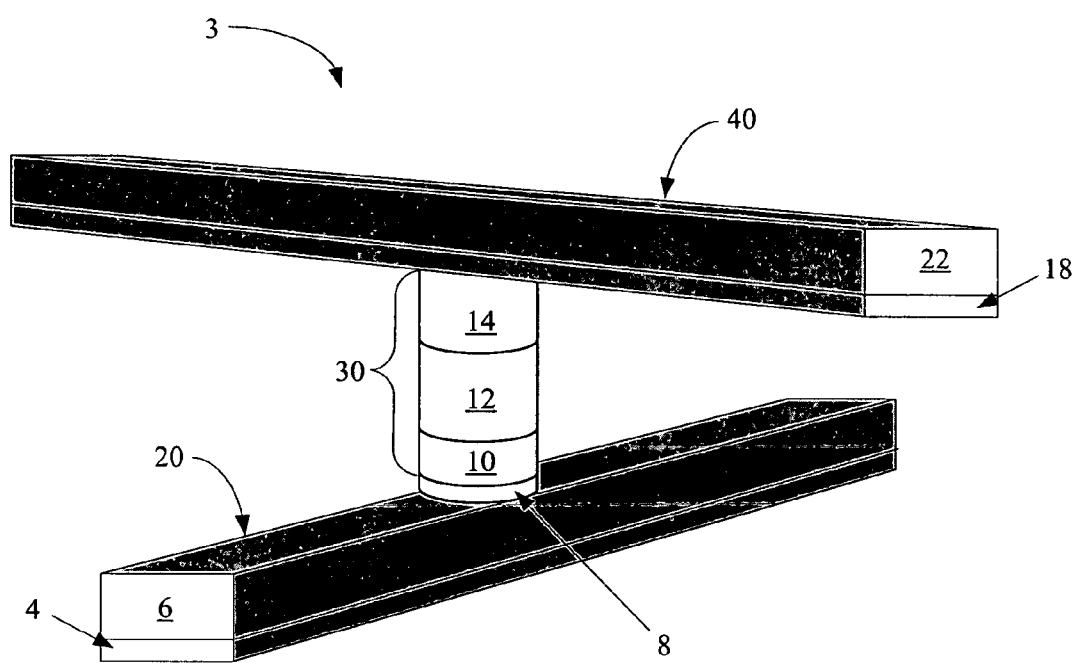
FIG. 1 is a perspective view of a memory cell formed according to the '549 application.

A preferred memory cell 2 formed according to the '549 application is shown in FIG. 1. A first conductor 20 preferably comprises titanium nitride layer 4 and tungsten layer 6. Junction diode 30 is formed on optional titanium nitride barrier layer 8 and comprises heavily doped semiconductor layer 10 of a first conductivity type; layer 12, which is undoped semiconductor material; and heavily doped semiconductor layer 14 of a second conductivity type opposite the first conductivity type. Second conductor 40 preferably comprises titanium nitride layer 18 and tungsten layer 22.

The initial state of memory cell 2 is high resistance. When a read voltage of, for example, about two or three volts is applied between first conductor 20 and second conductor 40 in the forward direction of junction diode 30, substantially no current flows between the conductors. After a programming voltage (about eight to nine volts, for example) has been applied between the conductors, however, the cell changes, and becomes more conductive. The change is permanent, such that when a read voltage of two or three volts is applied to a programmed cell, a readily detectable current flows between conductors 20 and 40. This difference in current when a read voltage is applied distinguishes a programmed cell from an unprogrammed cell.

In preferred embodiments, junction diode 30 of memory cell 2 comprises polycrystalline silicon, which will be referred to as polysilicon in this discussion. It is believed that in an unprogrammed cell, crystal defects present in the polysilicon and a large number of grain boundaries render the cell relatively high-resistance. Application of a programming voltage is believed to permanently change the physical characteristics of the polysilicon, perhaps causing formation of a durable lower-resistance path through junction diode 30. Preferred embodiments of the present invention use polysilicon, but it is expected that other semiconductor materials would exhibit the same properties and could be used instead.

A relatively large programming voltage is required to program a memory cell like the cell shown in FIG. 1. (To "program" a memory cell like memory cell 2 means to convert the cell from an initial unprogrammed, high-resistance state to a programmed, low-resistance state.) For many reasons, it is advantageous to minimize the programming voltage. Among the most important benefits to reduced programming voltage are a reduction in the size of driver circuitry required in the substrate and a decrease of leakage current on unselected and half-selected memory cells in an array during programming of a selected cell. Reducing leakage current reduces overall power usage in the device.

In the present invention, programming voltage is reduced by reducing the height of the polysilicon junction diode 30 of FIG. 1. The mechanism of programming is to cause a change in the physical characteristics of the polysilicon of junction diode 30, apparently inducing a local disorder-to-order transition of silicon in a filament traversing the diode; when a shorter length of polysilicon is to be converted, the conversion can be achieved at a lower voltage.

It should be noted that, as will be appreciated by those skilled in the art, programming is not solely a function of voltage; the reality is more complex. State-of-the-art memory chips may contain billions of cells, so one must consider the distribution of properties across a population. Suppose a memory cell can be programmed at eight volts in a very short time. It is possible to program the same memory cell at seven volts or less with a longer programming time. Similarly, using a programming voltage of eight volts may enable a very low or nonexistent programming failure rate. If a lower voltage is used for programming most cells may program successfully, but the failure rate may increase. If longer programming times and higher programming failure rates can be tolerated, lower voltage can be used to program the same cell.

It will be understood that a cell with reduced diode height according to the present invention can be programmed at a lower programming voltage than a cell with a taller diode while programming time and failure rate are substantially unchanged. It is possible to consider the outcome in a different way: For example, a cell including the shorter diode of the present invention can be programmed at a faster programming time than a cell having a taller diode while the programming voltage is unchanged.

Figure 2A:
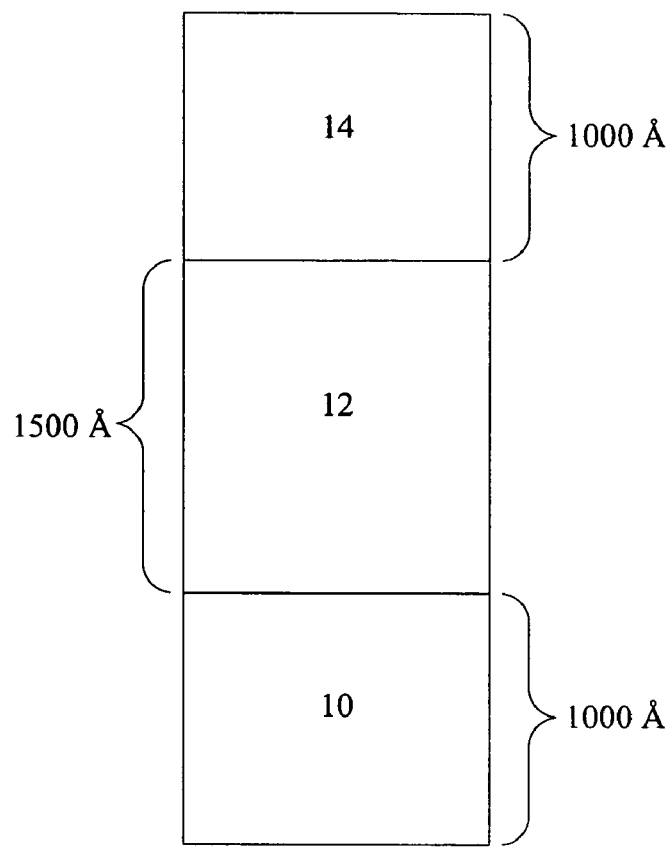
FIG. 2a and FIG. 2b are cross-sectional views showing, respectively, a full-height preferred diode of the '549 application and a reduced-height diode according to an embodiment of the present application.

An example of a diode used in one preferred embodiment of the memory cell of the '549 application is shown in FIG. 2a. The total height of the diode of FIG. 2a is about 3500 angstroms. Bottom heavily doped region 10 is about 1000 angstroms, middle intrinsic region 12 is about 1500 angstroms, and top heavily doped region 14 is about 1000 angstroms. An intrinsic region is one that is not intentionally doped.

A diode behaves as a one-way valve, allowing current flow in one direction only. In general in an array of non-volatile memory cells like those of the '549 application, each cell is disposed between a wordline and a bitline, and an individual cell is programmed by applying a programming voltage between its associated wordline and bitline. Depending on the biasing scheme employed, unselected cells and half-selected cells (other cells on the selected bitline or wordline) are also, subjected to some voltage, causing increased leakage current in those devices.

Figure 2B:
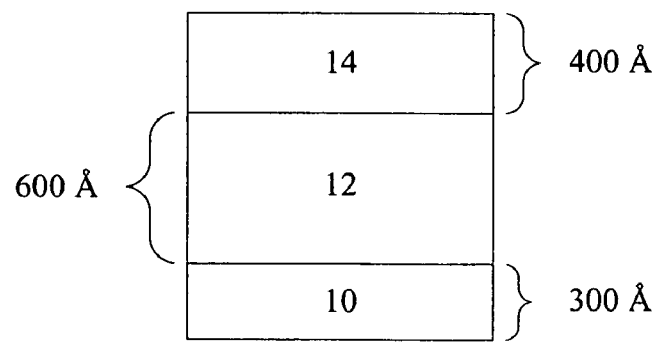

Specifically, a reverse bias may be applied to some unselected or half-selected cells that have previously been programmed. Some reverse leakage current may flow, which wastes power and degrades overall device performance. It has been observed that as the size of intrinsic region 12 decreases, reverse leakage current increases. It is believed that for reliable device performance, intrinsic region 12 is most advantageously at least about 300 angstroms, preferably at least about 500 angstroms, most preferably at least about 600 angstroms. In some embodiments, intrinsic region 12 is at least about 1000 angstroms in height. A reduced-height diode formed according to a preferred embodiment of the present invention is shown in FIG. 2b. The thickness of its middle intrinsic region 12 has been reduced to about 600 angstroms.

Figure 3:
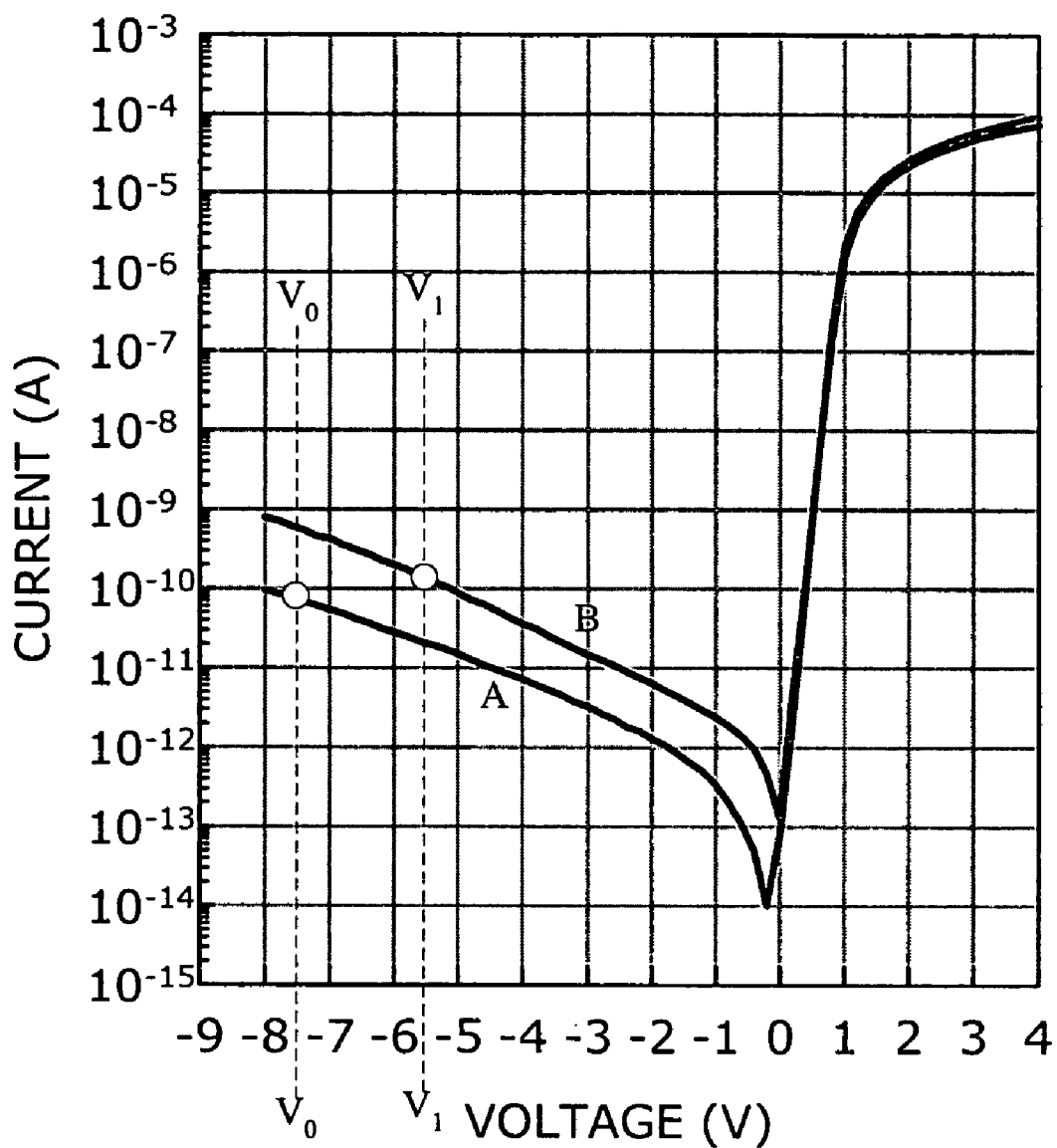
FIG. 3 is a graph showing current vs. voltage for full-height diodes and for reduced-height diodes according to the present invention.

As always, different aspects of cell and array behavior must be balanced. FIG. 3 shows two I-V curves which plot current vs. voltage for diodes having a height of 430 nm (on curve A) and for reduced height diodes having a height of 300 nm (on curve B.) When a cell is programmed, a positive voltage (greater than zero) is applied, the diode "turns on" and current flow increases sharply. As noted earlier, during programming of a selected cell, unselected and half-selected cells are subjected to reverse bias (voltages less than zero on this graph), and some undesired leakage current flows.

Suppose voltage $V_0$ is the voltage experienced by unselected cells when a selected cell is written. At voltage $V_0$, shorter diodes, on curve B, have a higher leakage current than taller diodes, on curve A. Using reduced height diodes according to the present invention, however, allows the use of lower programming voltage, which decreases the voltage $V_1$ that unselected cells experience during write of a selected cell. It will be seen that for this example leakage current for the shorter cells of curve B at $V_1$ is nearly the same as leakage current for the taller cells of curve A at $V_0$. The increased leakage caused by the smaller intrinsic regions of the shorter cells of curve B is compensated for by the lower voltage that can be used in an array of such cells.

In preferred embodiments, the diode of the present invention is a vertically oriented p-i-n diode, having a bottom heavily doped region, a middle intrinsic or lightly doped region, and a top heavily doped region. The bottom and top heavily doped regions are of opposite conductivity types, and the middle intrinsic region has a height of about between about 300 and about 1200 angstroms, preferably between about 600 angstroms and about 1000 angstroms. Ideally the top and bottom heavily doped regions are made as thin as possible; each of these regions, for example, may be between about 100 angstroms and about 400 angstroms thick. In one preferred embodiment, shown in FIG. 2b, bottom heavily doped region 10 is about 300 angstroms thick, middle intrinsic or lightly doped region 12 is about 600 angstroms thick, and top heavily doped region 14 is about 400 angstroms thick.

In another preferred embodiment, the bottom heavily doped region is about 100 angstroms thick, the middle intrinsic or lightly doped region is about 300 angstroms thick, and the top heavily doped region is about 100 angstroms thick. Such a p-i-n diode has a height of about 500 angstroms. In yet another preferred embodiment, the middle intrinsic or lightly doped region is about 600 angstroms thick, and the resulting p-i-n diode is about 800 angstroms in height. (In this discussion the vertical dimension of a layer, measured perpendicular to the substrate, will be described as its thickness, while the vertical dimension of the diode will be described as its height.)

To summarize, a memory cell like the cell of FIG. 1 can be formed in which the junction diode 30 is replaced with a diode reduced in height as shown in FIG. 2b. Such a nonvolatile memory cell comprises a rail-shaped first conductor formed at a first height above a substrate; a rail-shaped second conductor formed above the first conductor; a first vertically oriented pillar comprising a first p-i-n diode, the first pillar disposed between the second conductor and the first conductor, the first diode comprising an intrinsic or lightly doped region, wherein the intrinsic or lightly doped region has a first thickness of about 300 angstroms or greater, in some embodiments about 600 angstroms or greater, in other embodiments about 800 angstroms or greater. The diode height is between about 500 and about 3500 angstroms. In some embodiments the diode height is between about 1000 and about 3000 angstroms, preferably between about 1300 and about 3000 angstroms. In other embodiments the diode height is between about 1600 and about 2000 angstroms.

Such a cell is formed by a method comprising forming a rail-shaped first conductor; forming a vertically oriented junction diode comprising polysilicon above the first conductor; and forming a rail-shaped second conductor above the junction diode, wherein, after formation of the second conductor, the height of the junction diode is between about 500 angstroms and about 3500 angstroms. As will be seen, in preferred embodiments each of the first conductor, the junction diode, and the second conductor is formed in a separate patterning and etching step.

In preferred embodiments of the memory cell of FIG. 2b, heavily doped regions 10 and 14 have very high dopant concentration, in the range of about $10^{19}$ to about $10^{21}$ dopant atoms/cm$^3$. In situ doping, doping by flowing a gas that supplies dopant atoms as the silicon is deposited, allows doping to high dopant concentrations, but controlling the thickness of in situ doped regions can present challenges. Forming very thin regions doped to high dopant concentrations is advantageously done using methods that allow shallow doping, where the transition from highly doped to undoped or nominally undoped is very abrupt. Examples include ion implantation, plasma immersion, gas source diffusion, and solid source diffusion. Certain dopants may prove more advantageous than others, as will be discussed.

Memory Cell: Preferred Embodiment

One preferred embodiment of a reduced-height diode in which the heavily doped regions are formed using ion implantation will be described. It will be understood that this embodiment is only one of many forms the invention may take.

In the embodiment of FIG. 2a, bottom region 10 was typically formed by in situ doping using phosphorus as the dopant. Only about 100 to about 200 angstroms of heavily doped silicon (doped to about $8 \times 10^{20}$ dopant atoms/cm$^3$) is actually required for the device to operate as desired, but it is difficult to form this layer much thinner than the 1000 angstroms shown in FIG. 2a by in situ doping with phosphorus. To form bottom region 10, a gas that provides silicon atoms, for example silane, and a gas that provides phosphorus, such as phosphine, are flowed simultaneously, depositing phosphorus-doped silicon. Phosphorus atoms are in their lowest energy state at the surface of the deposited silicon, and will migrate upward seeking that surface. Thus the silicon deposited after the flow of phosphine is stopped continues to be doped with phosphorus for a substantial thickness. An in situ doped deposition technique that allows for a highly abrupt transition is preferred. Such a technique may include low temperature deposition with a Si-containing gas precursor that allows deposition at low temperatures but high deposition rates.

In reduced-height embodiments, such as the embodiment of FIG. 2b, bottom region 10 is doped by ion implantation of arsenic ions. To form this region, between about 100 and about 300 angstroms, preferably about 200 angstroms, of undoped silicon is deposited, then ion implantation is performed. After ion implantation, the rest of the silicon is deposited. Arsenic does not diffuse as rapidly in polysilicon as does phosphorus; thus the thickness of intrinsic region 12 can be reduced by the use of arsenic compared to phosphorus despite subsequent thermal processing. Such high temperature processing causes dopants to diffuse. In a preferred embodiment, after diffusion bottom heavily doped region 10 is between about 100 and about 400 angstroms in the completed device, preferably about 300 angstroms.

After ion implantation of heavily doped bottom region 10, an additional thickness of undoped silicon is deposited. In preferred embodiments of the present invention between about 800 and about 3000 angstroms is deposited, preferably about 1800 angstroms. As will be described in more detail below, once the silicon layer stack that will form the diode has been deposited, the pillars are patterned and etched, gaps between them filled with dielectric, and a planarization step is performed, for example by CMP. The CMP step will remove some thickness of silicon, for example about 800 angstroms. Alternatively, planarization can be performed by etchback, which will remove less silicon, for example about 400 angstroms, for example, as in Raghuram et al.

In the embodiment of FIG. 2a, top heavily doped region 14 was formed by ion implantation with boron to a dopant concentration of about $8 \times 10^{20}$ atoms/cm$^3$. During ion implantation, ion current—the number of ions directed at the surface—is proportional to the implant energy. Using most conventional equipment, it is most economical to implant using relatively high implant energy, for example about 5 kiloelectron volts (keV) or higher. At implant energy lower than about 5 keV, the time required to implant ions to high concentration increases dramatically, decreasing throughput and making large-scale production expensive. Newer models of implant equipment may overcome this problem.

Increasing implant energy decreases production cost, and is thus desirable. Increasing implant energy also increases implant depth, however, increasing the thickness of top heavily doped region 14 in FIG. 2a. This is undesirable if the diode is to be made is short as possible.

In the diode of FIG. 2b, top region 14 is doped by ion implantation, but boron diflouride (BF$_2$) ions are implanted rather than boron ions. These BF$_2$ ions have a higher mass than boron atoms; thus the same implant energy achieves a shallower doping concentration profile. Doping with BF$_2$ instead of boron allows the top heavily doped region of FIG. 2b to be thinner after the device is finished. (Use of another, heavier alternative source of boron, decaborane (B$_{10}$H$_{14}$), may also prove advantageous.) In the completed device, even after diffusion, in preferred embodiments top heavily doped region 14 is between about 100 and about 600 angstroms thick, preferably about 100 angstroms thick. If bottom heavily doped region 10 is 300 angstroms thick, middle region 12 is 600 angstroms thick, and top heavily doped region 14 is 400 angstroms thick, the diode of FIG. 2b has a total height of about 1300 angstroms. In one embodiment, to form such a diode the total height of deposited silicon was about 2100 angstroms, and about 800 angstroms was removed during CMP, leaving a diode 1300 angstroms in height.

If desired, the polarity of the diode just described could be reversed, such that the bottom heavily doped region is p-type, doped with boron or BF$_2$, and the top heavily doped region is n-doped, doped with arsenic.

Doping with BF$_2$ rather than boron provides an added benefit. In some embodiments of the present invention, the junction diode 30 is paired with a dielectric antifuse layer in series with it, usually formed of a thin silicon dioxide layer on top of heavily doped layer 14. This dielectric antifuse layer provides an additional barrier to current in an unprogrammed cell. When a programming voltage is applied to the cell, the silicon dioxide layer experiences dielectric breakdown, and a permanent conductive path through the silicon dioxide layer is formed. The silicon dioxide antifuse layer is advantageously formed by oxidizing the top portion of top heavily doped region 14. Conventionally such oxidation is performed at relatively high temperatures, for example at about 700 to about 900 degrees C. It has been found, however, that high-quality silicon dioxide can be formed by oxidation of silicon doped with BF$_2$ at lower temperatures, for example about 600 to about 700 degrees C. or less. The fluorine from the implant accelerates the growth of SiO$_2$ compared to a Si substrate that does not contain any F. So the same thickness of oxide can be grown on a BF$_2$ implanted substrate at a lower temperature compared to a substrate without F. Any decrease in processing temperature decreases the danger of adverse thermal side effects such as unwanted dopant diffusion and peeling between thermally incompatible adjacent layers and is thus desirable.

To summarize, a nonvolatile memory cell is formed by a method comprising forming a first rail-shaped conductor above a substrate; forming a second rail-shaped conductor above the first conductor; forming a first substantially vertical pillar disposed between the first conductor and the second conductor, the first pillar comprising a vertically oriented p-i-n diode, the p-i-n diode comprising a) a bottom heavily doped region having a first conductivity type, b) a middle intrinsic or lightly doped region, and c) a top heavily doped region having a second conductivity type opposite the first conductivity type, wherein the bottom heavily doped region is doped by implantation of arsenic ions and the top heavily doped region is doped by implantation of BF$_2$ ions.

In an array of such cells, the pillars are formed by a method comprising forming first bottom heavily doped regions doped (these regions doped either by in situ doping or ion implantation) having a first conductivity type; forming first middle intrinsic or lightly doped regions immediately above the first bottom heavily doped regions; and forming first top heavily doped regions immediately above the first middle intrinsic or lightly doped regions, the first top heavily doped regions doped by ion implantation and having a second conductivity type opposite the first conductivity type.

It has been described that undesirable reverse leakage current increases as the thickness of intrinsic region 12 decreases, and that the thickness of intrinsic region 12 is preferably at least about 300 angstroms. Acceptable levels of reverse leakage current (and thus acceptable thickness of intrinsic region 12) will depend on a variety of factors, including circuit layout and programming voltage. As programming voltage on the selected cell decreases, reverse leakage current on unselected and half-selected cells also decreases. The factors are thus interrelated: A thinner intrinsic region allows for a shorter diode, a shorter diode allows a lower programming voltage, and a lower programming voltage leads to decreased reverse leakage. That decreased reverse leakage in turn means that a thinner intrinsic region can be tolerated. The skilled practitioner will be accustomed to balancing such factors, using the examples provided herein as a guide.

Circuit layout and biasing schemes advantageously used in a monolithic three dimensional memory array formed according to embodiments of the present invention are described in Scheuerlein et al., U.S. patent application Ser. No. 10/335,078, "Programmable Memory Array Structure Incorporating Series-Connected Transistor Strings and Methods for Fabrication and Operation of Same," filed Dec. 31, 2002; and in Scheuerlein, U.S. patent application Ser. No. 10/403,844, "Word Line Arrangement Having Multi-Layer Word Line Segments for Three-Dimensional Memory Array," filed Mar. 31, 2003, both owned by the assignee of the present invention and hereby incorporated by reference.

A detailed example will be provided of fabrication of a monolithic three dimensional memory array formed according to a preferred embodiment of the present invention. For clarity many details, including steps, materials, and process conditions, will be included. It will be understood that this example is non-limiting, and that these details can be modified, omitted, or augmented while the results fall within the scope of the invention.

Array:Fabrication

The '470 and '549 applications described fabrication of monolithic three dimensional memory arrays comprising memory cells like those of FIG. 1. For simplicity, not all of the details of the '470 and '549 applications will be included, but it will be understood that no teaching of these applications is intended to be excluded.

Figure 4A:
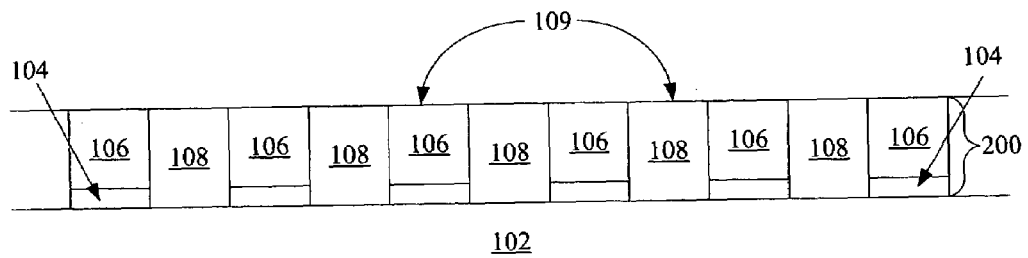
FIGS. 4a-4c are cross-sectional views showing stages in the fabrication of a memory array formed according to the present invention.

Turning to FIG. 4a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. Preferred materials for the adhesion layer 104 are tantalum nitride, tungsten nitride, titanium tungsten, sputtered tungsten, titanium nitride, or combinations of these materials. If the overlying conducting layer 106 is tungsten, titanium nitride is preferred as an adhesion layer.

If adhesion layer 104 is included, it can be deposited by any process known in the art. Where adhesion layer 104 is titanium nitride, it can deposited by depositing a titanium nitride material, or by depositing titanium, which is then subject to a nitridation process. The titanium nitride can be deposited by any chemical vapor deposition (CVD) process, physical vapor deposition (PVD) process such as sputtering, or an atomic layer deposition (ALD) process. In one embodiment, the titanium nitride material is deposited by a sputtering process.

The thickness of adhesion layer 104 can range from about 20 to about 500 angstroms. In one embodiment, the thickness of adhesion layer 104 is about 200 angstroms. Note that in this discussion, "thickness" will denote vertical thickness, measured in a direction perpendicular to substrate 100.

The next layer to be deposited is conducting layer 106. Conducting layer 106 can comprise any conducting material known in the art, including tantalum, titanium, tungsten, copper, cobalt, or alloys thereof. Titanium nitride may be used. Where conducting layer 106 is tungsten, it can be deposited by any CVD process or a PVD process. In one embodiment, the tungsten is deposited by a CVD process. The thickness of conducting layer 106 can depend, in part, on the desired sheet resistance and therefore can be any thickness that provides the desired sheet resistance. In one embodiment, the thickness of conducting layer 106 can range from about 200 to about 2000 angstroms. In another embodiment, the thickness of conducting layer 106 is about 1500 angstroms.

Once all the layers that will form the conductor rails have been deposited, the layers will be patterned and etched using any suitable masking and etching process to form substantially parallel, substantially coplanar conductors 200, shown in FIG. 4a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

The width of conductor rails 200 after etch can range from about 300 to about 2500 angstroms. (In this discussion "width" will refer to the dimension of a line or feature measured in the plane substantially parallel to substrate 100.) The width of the gaps between conductor rails 200 preferably is substantially the same as the width of conductor rails 200 themselves, though it may be greater or less. In one embodiment, the width of conductor rails is about 1300 angstroms, as is the width of the intervening gaps.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as CVD, or, for example, high density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 4a. This removal of dielectric overfill to form planar surface 109 can be performed by any process known in the art, such as chemical mechanical planarization (CMP) or etchback. For example, the etchback techniques described in Raghuram et al., U.S. application Ser. No. 10/883,417, "Nonselective Unpatterned Etchback to Expose Buried Patterned Features," filed Jun. 30, 2004 and hereby incorporated by reference in its entirety, can advantageously be used.

Alternatively, conductor rails can be formed by a Damascene process, in which oxide is deposited, lines are etched in the oxide, then the lines are filled with titanium nitride and tungsten to create the conductor rails. The titanium nitride and tungsten films on top of the original plane of oxide are removed by any process known in the art, such as CMP or etchback, leaving titanium nitride and tungsten wires, with dielectric material insulating the wires from one another.

To summarize, the conductors were formed by depositing a first conductive layer; patterning and etching the first conductive layer into the first conductors; depositing a first dielectric material on and between the first conductors; and planarizing to expose the first conductors separated by the first dielectric material.

Figure 4B:
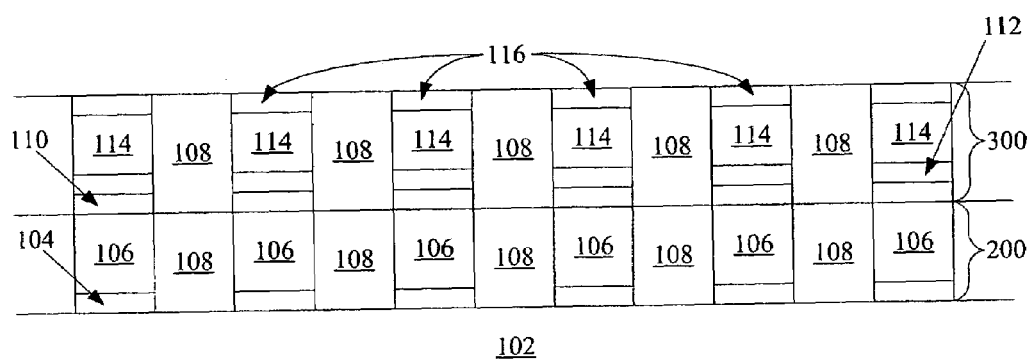

Next, turning to FIG. 4b, vertical pillars will be formed above completed conductor rails 200. (To save space substrate 100 is omitted in FIG. 4b; its presence will be assumed.) If tungsten was used for conductive layer 106, it is preferred to use a barrier layer 110 between the lower conductor rails 200 and the semiconductor material to be deposited. Preferred materials to be used for barrier layer 110 are tantalum nitride, tungsten nitride, titanium tungsten, sputtered tungsten, titanium nitride, or combinations of these materials. In a preferred embodiment, barrier layer 110 is formed of titanium nitride deposited by any conventional method, for example by sputtering. Its thickness can be, for example, about 20 to about 500 angstroms. The thickness of barrier layer 110 is preferably about 200 angstroms. If desired, barrier layer 110 could have been deposited, patterned and etched as the top layer of conductor rails 200 instead.

Next semiconductor material that will be patterned into pillars is deposited. The semiconductor material can be silicon, silicon-germanium, silicon-germanium-carbon, germanium, or other suitable IV-IV compounds, gallium arsenide, indium phosphide, or other suitable III-V compounds, zinc selinide, or other II-VII compounds, or a combination. Silicon is commonly used in the industry, so, for simplicity, this description will refer to the semiconductor material as silicon, but it will be understood that other materials may be substituted. In preferred embodiments, polysilicon is used.

In preferred embodiments, the semiconductor pillar comprises a junction diode, the junction diode comprising a bottom heavily doped region of a first conductivity type and a top heavily doped region of a second conductivity type. The middle region, between the top and bottom regions, is an intrinsic or lightly doped region of either the first or second conductivity type. The middle region can intentionally be lightly doped, or it can be intrinsic. An intrinsic region will never be perfectly electrically neutral, and will always have defects or contaminants that cause it to behave as if slightly n-doped or p-doped.

In this example, bottom heavily doped region 112 is heavily doped n-type silicon and top heavily doped region 116 is heavily doped p-type silicon.

In a most preferred embodiment, a thin layer of undoped silicon is deposited by any conventional method. This layer is between about 100 angstroms and about 800 angstroms, preferably about 200 to about 300 angstroms, most preferably about 300 angstroms. When deposited by most conventional methods, this thin silicon layer will be amorphous. In a preferred embodiment, for silicon films about 200 angstroms or thinner, deposition is performed by a CVD process at about 510 degrees C. and about 800 mTorr; these conditions help insure that the film is continuous. The wafers are removed from the deposition chamber and the undoped silicon layer is implanted with n-type dopant ions, preferably arsenic. In one embodiment the implant is performed at an implant energy between about 5 and about 10 keV. The dose is preferably about $5 \times 10^{15}/cm^2$.

Arsenic diffuses relatively slowly in polysilicon at the temperatures experienced during fabrication of this exemplary memory. After the memory is completed, bottom heavily doped region 112 will have a dopant concentration of about $1 \times 10^{19}$ to about $2 \times 10^{21}$ atoms/cm$^3$, and preferably about $8 \times 10^{20}$ atoms/cm$^3$ and will be between about 100 and about 600 angstroms thick, preferably about 300 angstroms thick.

To further inhibit diffusion of arsenic into the intrinsic region to be formed next, it may be advantageous to form a diffusion barrier. Immersing the wafer in nitric acid at a temperature of about 80 degrees C. for about ten minutes will form a very thin oxide layer. This oxide layer is too thin to serve as a significant electrical insulator, but will act as a barrier to arsenic diffusion.

Next the wafer is returned to the deposition chamber, and the silicon that will form the remainder of the diode is deposited. A subsequent planarization step will remove some silicon, so an extra thickness is deposited. If the planarization step is performed using a conventional CMP method, about 800 angstroms of thickness will be lost (this an average; the amount varies across the wafer. Depending on the slurry and methods used during CMP, the silicon loss may be more or less.) If the planarization step is performed by an etchback method, only about 400 angstroms of silicon or less may be removed. Depending on the planarization method to be used and the desired final thickness, between about 800 and about 2500 angstroms of undoped silicon is deposited by any conventional method; preferably between about 1500 and about 2500 angstroms; most preferably between about 1800 and about 2200 angstroms. For example, suppose, in the finished device, middle intrinsic region 114 is about 600 angstroms, top heavily doped region is 400 angstroms, and about 800 angstroms is expected to be lost to CMP. In this case about 1800 angstroms of silicon will be deposited in this step. If desired, the silicon can be lightly doped.

Returning to FIG. 4b, the silicon just deposited, along with barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Thus forming the first pillars comprises depositing a semiconductor layer stack on first conductors and first dielectric material and patterning and etching the semiconductor layer stack to form the first pillars. The total height of the semiconductor layer stack is between about 900 angstroms and about 4300 angstroms, preferably between about 1200 angstroms and about 4300 angstroms, most preferably between about 1600 angstroms and about 4000 angstroms. (A layerstack of 900 angstroms is deposited if the diode height is about 500 angstroms and about 400 angstroms is lost in a subsequent etchback step, for example.)

Dielectric material 108 is deposited over and between pillars 300, filling the gaps between them. Dielectric material 108 can be any known electrically insulating material, such as silicon oxide, silicon nitride, or silicon oxynitride. In a preferred embodiment, silicon dioxide is used as the insulating material. The silicon dioxide can be deposited using any known process, such as CVD, or, for example, high density plasma CVD.

Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al. can be used. The resulting structure is shown in FIG. 4b.

In preferred embodiments, heavily doped top regions 116 should be formed by ion implantation. Ions of a p-type dopant, preferably $BF_2$, are implanted using an implant energy greater than about 4 keV, preferably between about 5 and about 12 keV, most preferably about 5 keV. The dose is preferably about $5 \times 10^{15}/cm^2$. Some dopant diffusion will take place; in the completed cell top heavily doped region 116 will have adopant concentration of about $2 \times 10^{19}$ to about $1 \times 10^{21}$ atoms/$cm^3$, preferably about $8 \times 10^{20}$ atoms/$cm^3$, and will be about 400 angstroms thick.

Middle intrinsic or lightly doped region 114 remains between bottom heavily doped region 112 and top heavily doped region 116. Preferably middle intrinsic or lightly doped region 114 has a height of at least 300 angstroms. In preferred embodiments, the height of intrinsic region 114 is between about 600 and about 1200 angstroms, for example between about 800 and about 1000 angstroms. This height is in the completed device, before the device has been programmed and after all thermal processing, and thus all significant dopant diffusion, has taken place.

In this example a top heavily doped region and a bottom heavily doped region has been formed in each of the diodes, wherein the top and the bottom heavily doped regions are not doped by in situ doping. In other embodiments, the top or bottom heavily doped region may be formed by in situ doping.

Figure 4C:
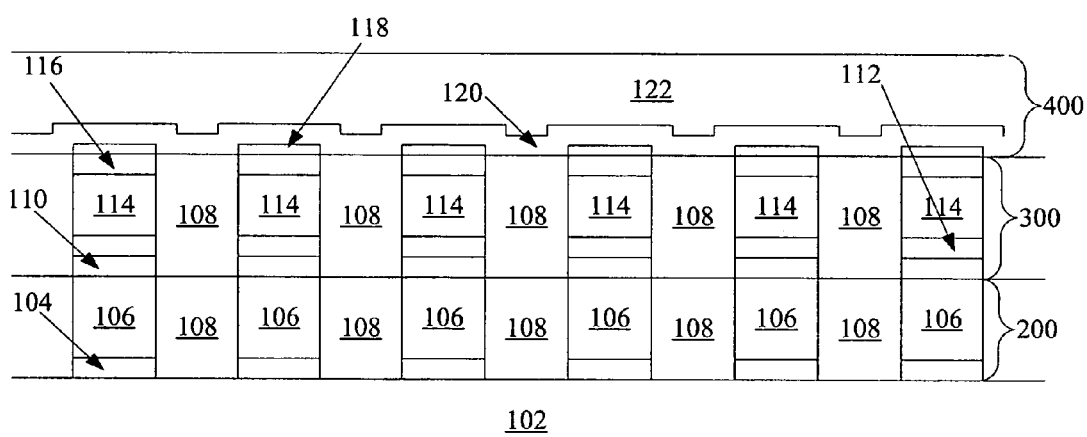

Turning to FIG. 4c, it may be desirable to form a dielectric antifuse layer 118 on each semiconductor pillar 300. This layer is optional, and is not formed in all embodiments. This dielectric antifuse layer 118 can be of any suitable dielectric material, for example an oxide, nitride or oxynitride. In one embodiment, dielectric antifuse layer 118 can be a silicon dioxide layer formed by oxidizing a portion of top heavily doped region 116 of each semiconductor pillar 300. Oxidation can be performed at, for example, about 600 degrees C. for about 60 seconds to form a silicon dioxide layer 118 about 20 angstroms thick. Alternatively, a dielectric layer could be deposited instead. A deposited dielectric layer could comprise silicon dioxide or other materials, for example aluminum oxide, titanium oxide, etc.

Dielectric antifuse layer 118 may not be formed, however: In other embodiments no dielectric layer is disposed between the first vertically oriented pillar and the first conductor, between the first vertically oriented pillar and the second conductor, or within the vertically oriented pillar.

Overlying conductors can be formed in the same manner as the underlying conductors. In a preferred embodiment shown in FIG. 4c, overlying conductors 400 comprise titanium nitride barrier layer 120 and tungsten layer 122, which can be deposited, patterned and etched as described earlier. Overlying second conductors 400 will preferably extend in a different direction from first conductors 200, preferably substantially perpendicular to them. The resulting structure is a bottom or first story of memory cells.

This first story of cells was formed by a method comprising forming a plurality of substantially parallel, substantially coplanar first conductors at a first height above a substrate; forming a plurality of vertically oriented first pillars comprising vertically oriented first polysilicon diodes above the first conductors; and forming a plurality of substantially parallel, substantially coplanar second conductors above the first pillars, wherein, after formation of the second conductors, the first polysilicon diodes have a height between about 500 angstroms and about 3500 angstroms.

Figure 5A:
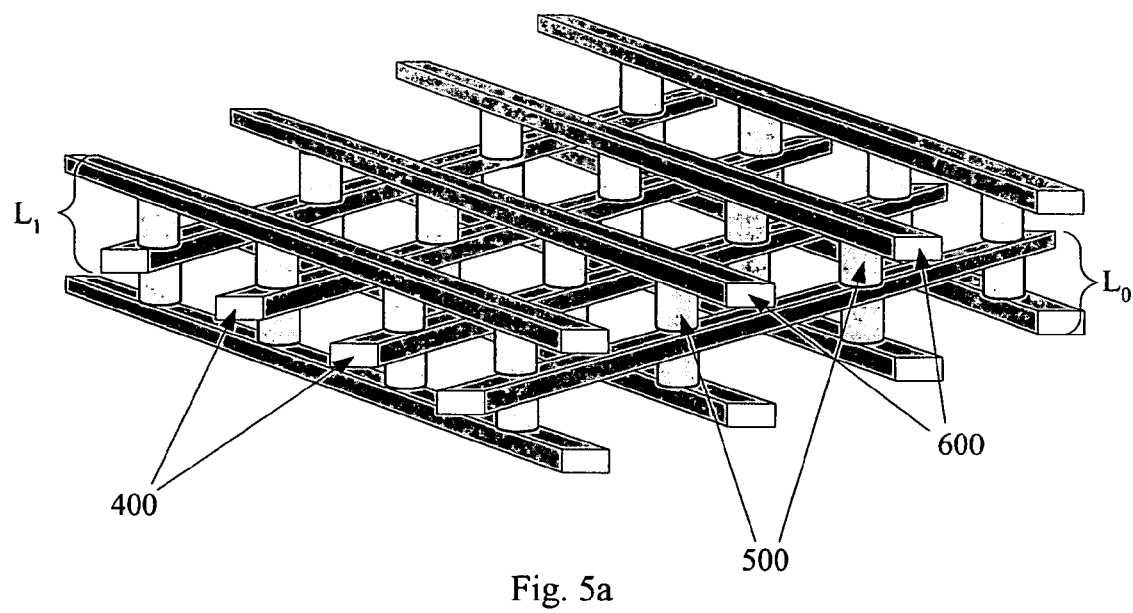
Figure 5B:
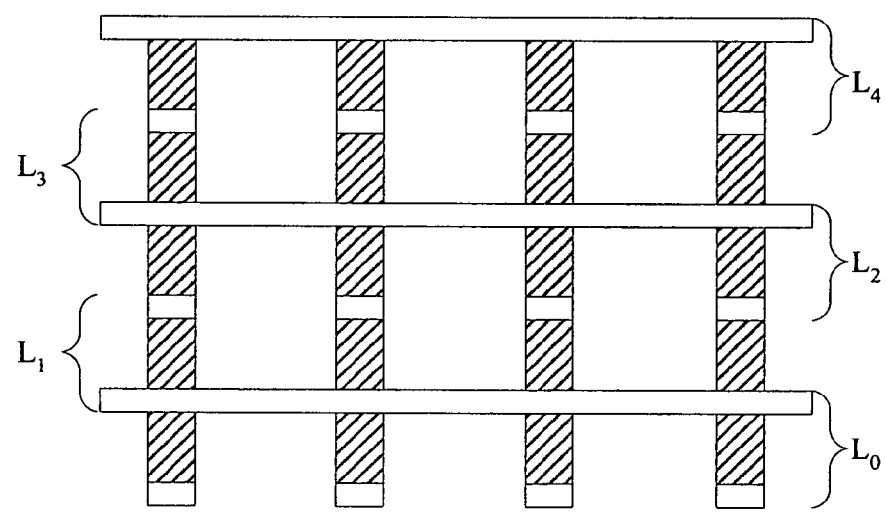
FIG. 5b is a cross-sectional view.

By continuing to form semiconductor pillars and conductors, further memory cells can be built above this first story. Turning to FIG. 5a, for example, a second level of pillars 500 can be formed on the second conductors 400, then third conductors 600 (preferably extending in substantially the same direction as the first conductors 400) formed on the second pillars 500. Each of the second pillars 500 (each including a diode) is disposed between one of second conductors 400 and one of third conductors 600. As shown in FIG. 5a, the upper conductors of the lower story of cells $L_0$ will serve as the lower conductors of an overlying, second story of cells $L_1$. FIG. 5b is a cross-sectional view of the same memory array, showing additional levels $L_2$ through $L_4$ formed by continuing to form levels of pillars and conductors, the conductors shared between levels.

Figure 6A:
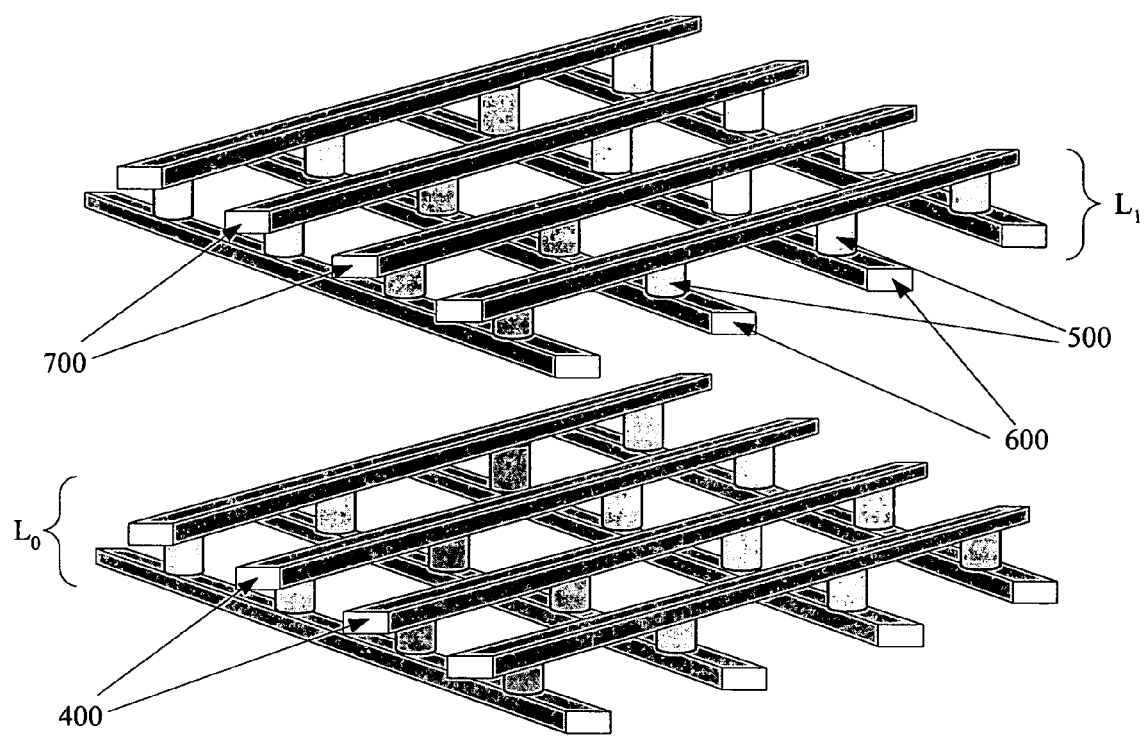
Figure 6B:
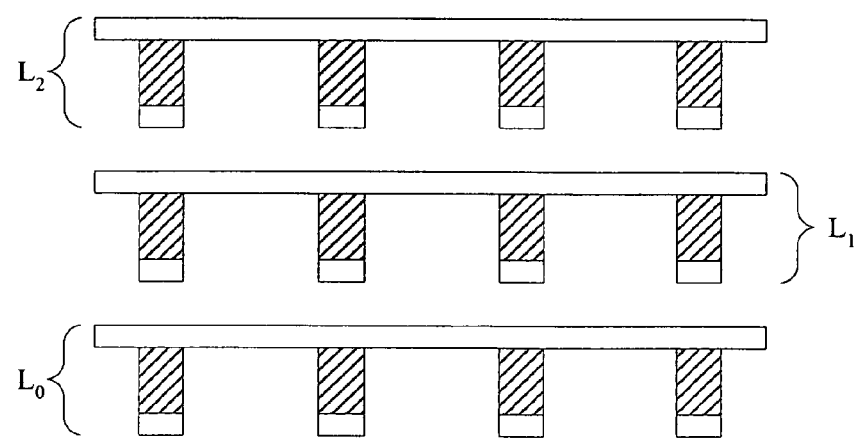
FIG. 6b is a cross-sectional view.

Alternatively, turning to FIG. 6a, the first and second memory levels can be separated by dielectric (not shown) and not share a level of conductors. Third conductors 600 are not shared with first level $L_0$, and each of second pillars 500 is disposed between one of third conductors 600 and one of fourth conductors 700. The vertical distance between the first level $L_0$ and the second level $L_1$ is exaggerated for clarity. FIG. 6b is a cross-sectional view, showing additional level $L_2$ formed by continuing to form levels of pillars and conductors, the conductors not shared between levels.

Ultimately the memory can be several stories high. In a preferred embodiment, the memory can contain from two to twelve stories. In another preferred embodiment, the memory contains eight stories.

To generalize, a monolithic three dimensional memory array according to the an embodiment of the present invention comprises i) a first memory level, the first memory level comprising: a) a plurality of substantially parallel, substantially coplanar first conductors formed above a substrate; b) a plurality of substantially parallel, substantially coplanar second conductors formed above the first conductors; and c) a plurality of vertically oriented first junction diodes, each first junction diode disposed between one of the first conductors and one of the second conductors, wherein the first junction diodes have a first height between about 500 angstroms and about 3500 angstroms; and ii) at least a second memory level monolithically formed on the first memory level.

Such an array is formed by forming a first plurality of substantially parallel, substantially coplanar rail-shaped conductors above a substrate; forming a second plurality of substantially parallel, substantially coplanar rail-shaped conductors above the first conductors; forming a first plurality of substantially vertical pillars, each first pillar disposed between one of the first conductors and one of the second conductors, each of the first pillars comprising a vertically oriented p-i-n diode, each p-i-n diode comprising a) a bottom heavily doped region having a first conductivity type, b) a middle intrinsic or lightly doped region, and c) a top heavily doped region having a second conductivity type opposite the first conductivity type, wherein the bottom heavily doped region is doped by implantation of arsenic ions and the top heavily doped region is doped by implantation of $BF_2$ ions.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No.

6,420,215, "Three Dimensional Memory Array and Method of Fabrication"; Herner, U.S. application Ser. No. 10/095,962, "Silicide-Silicon Oxide-Semiconductor Antifuse Device and Method of Making," filed Mar. 13, 2002; Vyvoda et al., U.S. patent application Ser. No. 10/185,507, "Electrically Isolated Pillars in Active Devices," filed Jun. 27, 2002; Vyvoda, U.S. patent application Ser. No. 10/440,882, "Rail Schottky Device and Method of Making", filed May 19, 2003; and Cleeves et al., "Optimization of Critical Dimensions and Pitch of Patterned Features in and Above a Substrate," U.S. patent application Ser. No. 10/728,451, filed Dec. 5, 2003, all assigned to the assignee of the present invention and hereby incorporated by reference. As appropriate, the methods of the present invention can be used in conjunction with the memories described in these patents and applications to form monolithic three dimensional memory arrays according to the present invention.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The present invention has been described herein in the context of a monolithic three dimensional memory array formed above a substrate. Such an array comprises at least a first memory level formed at a first height above the substrate and a second memory level formed at a second height different from the first height. Three, four, eight, or more memory levels can be formed above the substrate in such a multilevel array.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a plurality of nonvolatile memory cells, the method comprising:
   forming a plurality of substantially parallel, substantially coplanar first conductors at a first height above a substrate;
   forming a plurality of vertically oriented first pillars comprising vertically oriented first polysilicon diodes above the first conductors; and
   forming a plurality of substantially parallel, substantially coplanar second conductors above the first pillars,
   wherein, after formation of the second conductors, the first polysilicon diodes have a height between about 500 angstroms and about 3500 angstroms.

2. The method of claim 1 wherein the first polysilicon diodes have a height between about 800 angstroms and about 2500 angstroms.

3. The method of claim 1 wherein the step of forming the first conductors comprises:
   depositing a first conductive layer;
   patterning and etching the first conductive layer into the first conductors;
   depositing a first dielectric material on and between the first conductors; and
   planarizing to expose the first conductors separated by the first dielectric material.

4. The method of claim 3 wherein the step of forming the first pillars comprises:
   depositing a semiconductor layer stack on the first conductors and the first dielectric material; and
   patterning and etching the semiconductor layer stack to form the first pillars.

5. The method of claim 4 wherein the step of forming the first pillars further comprises forming a top heavily doped region in each of the first pillars by ion implantation.

6. The method of claim 5 wherein, during ion implantation, $BF_2$ ions are implanted.

7. The method of claim 5 wherein the ion implantation is performed at an implant energy of more than about 4 keV.

8. The method of claim 4 wherein the step of forming the semiconductor layerstack comprises depositing a thickness of between about 1200 angstroms and about 4300 angstroms of semiconductor material.

9. The method of claim 8 wherein the thickness of the semiconductor material is between about 1600 angstroms and about 4000 angstroms.

10. The method of claim 8 further comprising, after the step of patterning and etching the semiconductor layer stack:
    depositing a second dielectric material over and between the first pillars; and
    planarizing to expose tops of the first pillars.

11. The method of claim 10 further comprising, after the step of planarizing to expose the tops of the first pillars, forming an oxide layer by oxidation of a portion of the first pillars.

12. The method of claim 10 wherein the planarizing step comprises chemical mechanical planarization.

13. The method of claim 4 wherein the step of forming the first pillars further comprises forming a top heavily doped region and a bottom heavily doped region in each of the first diodes, wherein the top and the bottom heavily doped regions are not doped by in situ doping.

14. The method of claim 13 wherein the top heavily doped region or the bottom heavily doped region is doped by ion implantation, plasma immersion, gas source diffusion, or solid source diffusion.

15. The method of claim 14 wherein the top heavily doped region or the bottom heavily doped region is doped by ion implantation.

16. The method of claim 15 wherein, during ion implantation, arsenic ions are implanted.

17. The method of claim 15 wherein, during ion implantation, $BF_2$ ions are implanted.

18. The method of claim 4 wherein the step of forming the first pillars further comprises forming a bottom heavily doped region in each of the first diodes by in situ doping.

19. A method for forming a nonvolatile memory cell, the method comprising:
    forming a rail-shaped first conductor;
    forming a vertically oriented junction diode comprising polysilicon above the first conductor; and
    forming a rail-shaped second conductor above the junction diode,
    wherein, after formation of the second conductor, the height of the junction diode is between about 500 angstroms and about 3500 angstroms.

20. The method of claim 19 wherein each of the first conductor, the junction diode, and the second conductor is formed in a separate patterning and etching step.

21. The method of claim 19 wherein the height of the junction diode is between about 800 angstroms and about 3000 angstroms.

22. The method of claim 21 wherein, after formation of the second conductor, the height of the junction diode is between about 1300 angstroms and about 2500 angstroms.

23. The method of claim 19 wherein the step of forming the junction diode comprises:
   depositing a semiconductor layer stack; and
   patterning and etching the semiconductor layer stack into first pillars.

24. The method of claim 23 wherein each junction diode comprises:
   a bottom heavily doped region of a first conductivity type;
   a middle lightly doped or intrinsic region; and
   a top heavily doped region of a second conductivity type, the second conductivity type opposite the first conductivity type.

25. The method of claim 24 wherein the top heavily doped region is not doped by in situ doping.

26. The method of claim 25 wherein the top heavily doped region is doped by ion implantation, plasma immersion, gas source diffusion, or solid source diffusion.

27. The method of claim 26 wherein the top heavily doped region is doped by ion implantation.

28. The method of claim 27 wherein the top heavily doped region is doped with $BF_2$ ions.

29. The method of claim 27 wherein the ion implantation is performed with an implant energy greater than about 4 kiloelectron volts.

30. The method of claim 24 wherein the bottom heavily doped region is not doped by in situ doping.

31. The method of claim 30 wherein the bottom heavily doped region is doped by ion implantation, plasma immersion, gas source diffusion, or solid source diffusion.

32. The method of claim 31 wherein the bottom heavily doped region is doped by ion implantation.

33. The method of claim 32 wherein the top heavily doped region is doped with arsenic ions.

* * * * *